US012685118B2

(12) United States Patent
Maes et al.

(10) Patent No.: US 12,685,118 B2
(45) Date of Patent: Jul. 14, 2026

(54) METHODS AND SYSTEMS FOR FILLING A GAP

(71) Applicant: ASM IP Holding B.V., Almere (NL)

(72) Inventors: Jan Willem Maes, Wilrijk (BE); Elina Färm, Helsinki (FI); Charles Dezelah, Helsinki (FI); Shinya Iwashita, Helsinki (FI)

(73) Assignee: ASM IP Holding B.V., Almere (NL)

(*) Notice: Subject to any disclaimer, the term of this patent is extended or adjusted under 35 U.S.C. 154(b) by 915 days.

(21) Appl. No.: 17/953,847

(22) Filed: Sep. 27, 2022

(65) Prior Publication Data

US 2023/0096838 A1 Mar. 30, 2023

Related U.S. Application Data

(60) Provisional application No. 63/261,888, filed on Sep. 30, 2021.

(51) Int. Cl.

| | |
|---|---|
| ***H10W 20/00*** | (2026.01) |
| ***C23C 16/18*** | (2006.01) |
| ***C23C 16/455*** | (2006.01) |
| ***H10P 14/60*** | (2026.01) |

(52) U.S. Cl.

CPC ........... *H10W 20/098* (2026.01); *C23C 16/18* (2013.01); *C23C 16/45553* (2013.01); *H10P 14/6339* (2026.01); *H10P 14/6516* (2026.01)

(58) Field of Classification Search

CPC ........... H01L 21/76837; H01L 21/0228; H01L 21/02318; H01L 21/76877; H01L 23/53257; H01L 21/02175; H01L 21/0223; H01L 21/02247; H01L 21/28556; H01L 21/76886; C23C 16/18; C23C 16/45553; C23C 16/34; C23C 16/45527; C23C 16/045; C23C 16/56

See application file for complete search history.

(56) References Cited

U.S. PATENT DOCUMENTS

| | | | | |
|---|---|---|---|---|
| 6,623,799 | B1 | 9/2003 | Lee | |
| 11,066,743 | B2 | 7/2021 | Chen et al. | |
| 11,295,980 | B2 | 4/2022 | Zope et al. | |
| 2001/0019891 | A1 | 9/2001 | Koh | |
| 2008/0113110 | A1 | 5/2008 | Elers et al. | |
| 2009/0130466 | A1* | 5/2009 | Cheng | C07F 1/005 556/113 |
| 2015/0371899 | A1* | 12/2015 | Zhang | H01L 21/76874 438/666 |
| 2019/0067014 | A1 | 2/2019 | Shrestha et al. | |

(Continued)

FOREIGN PATENT DOCUMENTS

WO 2021183728 A1 9/2021

OTHER PUBLICATIONS

Antti Niskanen et al., "Radical-Enhanced Atomic Layer Deposition of Metallic Copper Thin Films," Journal of The Electrochemical Society, 152 (1) G25-G28 (2005).

(Continued)

*Primary Examiner* — Michael G Miller

(74) *Attorney, Agent, or Firm* — Snell & Wilmer L.L.P.

(57) ABSTRACT

Disclosed are methods and systems for filling a gap. An exemplary method comprises providing a substrate to a reaction chamber. The substrate comprises the gap. The method comprises filling the gap with a metal-containing material.

19 Claims, 8 Drawing Sheets

(56) References Cited

U.S. PATENT DOCUMENTS

| | | | | |
|---|---|---|---|---|
| 2019/0185993 | A1* | 6/2019 | Chen | C23C 16/04 |
| 2021/0214842 | A1 | 7/2021 | Yoon | |
| 2021/0285102 | A1* | 9/2021 | Yoon | H01L 21/0228 |
| 2022/0139713 | A1 | 5/2022 | Färm | |

OTHER PUBLICATIONS

Hyungsang Park et al., "Superfilling CVD of Copper Using A Catalytic Surfactant," 2001 IEEE; 3pp.

* cited by examiner

METHODS AND SYSTEMS FOR FILLING A GAP

CROSS-REFERENCE TO RELATED APPLICATIONS

This application claims priority to U.S. Provisional Patent Application Ser. No. 63/261,888, filed Sep. 30, 2021, and titled METHODS AND SYSTEMS FOR FILLING A GAP, the disclosure of which is hereby incorporated by reference in its entirety.

FIELD OF INVENTION

The present disclosure generally relates to the field of semiconductor processing methods and systems, and to the field integrated circuit manufacture. In particular, methods and systems suitable for filling a gap are disclosed.

BACKGROUND OF THE DISCLOSURE

The scaling of semiconductor devices, such as, for example, logic devices and memory devices, has led to significant improvements in speed and density of integrated circuits. However, conventional device scaling techniques face significant challenges for future technology nodes.

For example, one challenge has been finding suitable ways of filling gaps such as recesses, trenches, vias and the like with a material without formation of any gaps or voids. A seam or void in a gap can cause problems during subsequent etching or planarizing steps, which are common in integrated circuit manufacture.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of filling a gap, to structures and devices formed using such methods, and to apparatus for performing the methods and/or for forming the structures and/or devices. The layers may be used in a variety of applications. For example, they may be used in the field of integrated circuit manufacture.

Thus described herein is a method of filling a gap. The method comprises providing a substrate to a reaction chamber. The substrate comprises the gap. The substrate further comprises a proximal surface. The gap comprises a distal end and a sidewall. The method further comprises executing a plurality of deposition cycles. A deposition cycle comprises a precursor pulse and a halogen reactant pulse.

The precursor pulse comprises exposing the substrate to a precursor. The precursor comprises a compound that has the general formula formula $ML_n$. It shall be understood that M is a metal, L is an aromatic ligand, and n is an integer from at least 1 to at most 6.

The halogen reactant pulse comprises exposing the substrate to a halogen reactant. The halogen reactant comprises a halogen.

Thus, the gap is at least partially filled by preferentially forming a metal-containing material on the distal end compared to the proximal surface and the sidewall.

In some embodiments, the distal end and the sidewall both comprise a dielectric material.

In some embodiments, the distal end and the sidewall both comprise at least one of a metallic material and a semiconducting material.

In some embodiments, the aromatic ligand is a substituted or unsubstituted benzene ring.

In some embodiments, the ligand is an alkylbenzene.

In some embodiments, the metal is molybdenum.

In some embodiments, the precursor comprises bis(ethylbenzene)molybdenum.

In some embodiments, the halogen reactant comprises an alkyl halide.

In some embodiments, the halogen reactant comprises an alkyl iodide.

In some embodiments, the halogen reactant has a general formula $X_aR_bC—CX_aR'_b$, wherein X is a halogen, R and R' are independently H or an alkyl group, and a and b are independently 1 or 2, so that for each carbon atom a+b=3.

In some embodiments, the halogen reactant comprises a bond selected from a X—X bond, a H—X bond, a C—X bond, a P—X bond, a N—X bond, and a S—X bond; wherein X is a halogen.

In some embodiments, the deposition cycle further comprises a nitrogen reactant pulse, the nitrogen reactant pulse comprising exposing the substrate to a nitrogen reactant.

In some embodiments, the nitrogen reactant comprises $NH_3$.

In some embodiments, the deposition cycle further comprises an oxygen reactant pulse. The oxygen reactant pulse comprises exposing the substrate to an oxygen reactant.

In some embodiments, the deposition cycle further comprises a carbon reactant pulse. The carbon reactant pulse comprises exposing the substrate to a carbon reactant.

In some embodiments, a method as described herein comprises executing one or more super cycles. Executing a super cycle comprises executing a deposition cycle; and, a step of exposing the substrate to a transformation treatment.

In some embodiments, the transformation treatment comprises exposing the substrate to a thermal anneal.

In some embodiments, the thermal anneal comprises at least one of exposing the substrate to an oxidizing agent, a nitridation agent, a reducing agent, and a noble gas.

Further described herein is an integrated circuit that comprises a gap. The gap is filled by means of a method as described herein.

Further described is a system. The system comprises a reaction chamber. The system further comprises a metal precursor gas source. The metal precursor gas source comprises a metal precursor. The system further comprises a halogen reactant gas source. The halogen reactant gas source comprises a halogen reactant. The system further comprises a controller. The controller is configured to control gas flow into the reaction chamber to fill a gap comprised in a substrate by means of a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
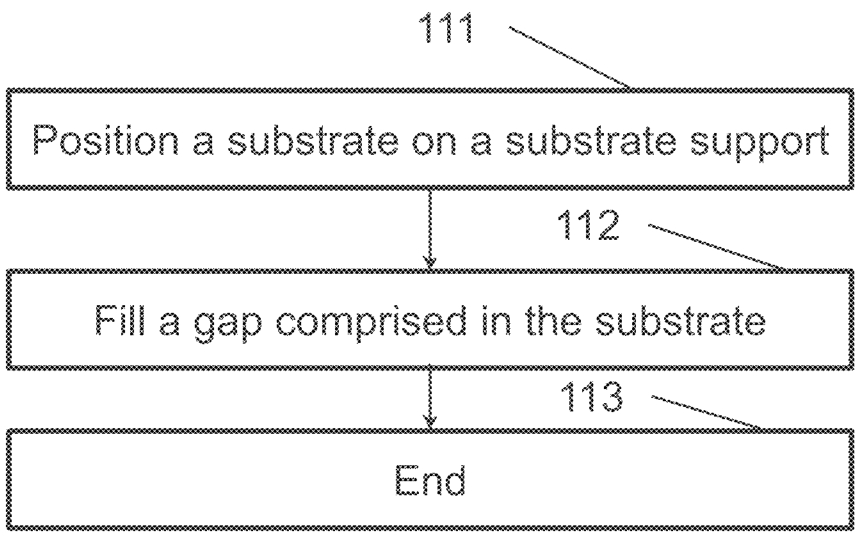
FIG. 1 illustrates an embodiment of a method as disclosed herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that is comprised in a film matrix or a main skeleton of a material that is formed by means of a method as described herein; the term "reactant" can be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include at least one of bulk semiconductor material and an insulating or dielectric material layer overlying at least a portion of the bulk semiconductor material. A gap can be comprised in the bulk of a substrate, or in one or more layers overlying the bulk of a substrate.

The term "deposition process" as used herein can refer to the introduction of precursors (and/or reactants) into a reaction chamber to deposit a layer over a substrate. "Cyclical deposition processes" are examples of "deposition processes".

A method as described herein can comprise forming a material by means of a cyclic deposition process. The term "cyclic deposition process" or "cyclical deposition process" can refer to a sequential introduction of precursors (and/or reactants) into a reaction chamber to form a material in a gap and includes processing techniques such as atomic layer deposition (ALD), cyclical chemical vapor deposition (cyclical CVD), and hybrid cyclical deposition processes that include an ALD component and a CVD component.

A method as described herein can comprise filling a gap by means of an atomic layer deposition process. The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). A substrate surface can comprise a physisorbed or chemisorbed catalyst, such as a halogen-containing catalyst. After introducing precursor into the reaction chamber, a reactant (e.g., another precursor or reaction gas) may subsequently be introduced into the process chamber for use in converting the chemisorbed precursor to the desired material on the deposition surface. The halogen reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which a purge gas is provided to a reaction chamber in between two pulses of gasses that react with each other. For example, a purge, e.g. using a noble gas, may be provided between a precursor pulse and a reactant pulse, thus avoiding or at least minimizing gas phase interactions between the precursor and the halogen reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "metal precursor" includes a gas or a material that can become gaseous and that can be represented by a chemical formula that includes a metal that may be incorporated during a deposition process as described herein.

The term "oxygen reactant" can refer to a gas or a material that can become gaseous and that can be represented by a chemical formula that includes oxygen. In some cases, the chemical formula includes oxygen and hydrogen.

The term "nitrogen reactant" can refer to a gas or a material that can become gaseous and that can be represented by a chemical formula that includes nitrogen. In some cases, the chemical formula includes nitrogen and hydrogen.

The term "carbon reactant" can refer to a gas or a material that can become gaseous and that can be represented by a chemical formula that includes carbon. In some embodiments, the chemical formula includes carbon and hydrogen.

The term "halogen reactant" can refer to a gas or a material that can become gaseous and that can be represented by a chemical formula that includes a halogen. In some embodiments, the chemical formula further includes one or more of carbon and hydrogen.

Further, in this disclosure, any two numbers of a variable can constitute a workable range of the variable, and any ranges indicated may include or exclude the endpoints. Additionally, any values of variables indicated may refer to precise values or approximate values and include equivalents, and may refer to average, median, representative, majority, or the like.

Further, it shall be understood that the term "comprising", when referring to certain features, indicates those features are included, but that the presence of other features is not excluded, as long as they do not render the corresponding embodiment unworkable. It shall be understood that the meaning of the term "comprising" includes the meaning of the term "consisting". The term "consisting" indicates that no further features are present in the corresponding embodiment apart from the ones following said wording. The term "comprising" includes the meaning of the term "substantially consisting". The term "substantially consisting" indicates that no further features are present in the corresponding embodiments apart from the ones following said wording, except when those further features do not have any material effect on the properties or function of the corresponding embodiment.

It shall be understood that a distal portion of a gap refers to a portion of the gap feature that is relatively far removed from a substrate's surface, and that the proximal portion of a gap feature refers to a part of the gap feature that is closer to the substrate's surface compared to the lower/deeper/farther removed portion of the gap feature. It shall be understood that a gap is not necessarily oriented in a direction that is substantially perpendicular to a substrate's surface. On the contrary, obliquely oriented gaps are possible. In addition, and in some embodiments, gaps can be, or can comprise portions that are, substantially parallel to a substrate's surface.

In this disclosure, any defined meanings do not necessarily exclude ordinary and customary meanings, in some embodiments.

Described herein is a method of filling a gap. The method can be suitably characterized as a vapor phase deposition method. The method comprises providing a substrate to a reaction chamber. The substrate further comprises a proximal surface. The gap comprises a distal end and a sidewall. A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc.

It shall be understood that the substrate comprises the gap. The method comprises executing a plurality of deposition cycles. A deposition cycle comprises a precursor pulse and a halogen reactant pulse.

The precursor pulse comprises exposing the substrate to a precursor. The precursor comprises a compound that has the general formula $ML_n$. It shall be understood that M is a metal, L is an aromatic ligand, and n is an integer from at least 1 to at most 6.

The halogen reactant pulse comprises exposing the substrate to a halogen reactant. The halogen reactant comprises a halogen.

Thus, the gap is at least partially filled. While filling the gap, a metal-containing material is preferentially formed on the distal end of the gap compared to the proximal surface of the substrate and the sidewall of the gap. In other words, metal-containing material is formed on the distal end with a relatively high growth rate compared to the growth rate at which metal-containing material is formed on the sidewall and on the proximal surface. For example, the growth rate at which material is formed on the distal end of the gap can be 10 times, 5 times, 2 times, 1.5 times, 1.2 times, or 1.1 times the growth rate at which material is formed on at least one of the sidewall of the gap and the proximal surface of the substrate.

The materials formed according to the present methods can be advantageously used in the field of integrated circuit manufacture.

In some embodiments, the metal-containing material comprises an alkali metal. In such embodiments, the precursor suitably comprises an alkali metal. In other words, and in some embodiments, M is an alkali metal. Suitable alkali metals include Li, Na, K, Rb, and Cs.

In some embodiments, the metal-containing material comprises an alkaline earth metal. In such embodiments, the precursor suitably comprises an alkaline earth metal. In other words, and in some embodiments, M is an alkaline earth metal. Suitable alkaline earth metals include Be, Mg, Ca, Sr, and Ba.

In some embodiments, the metal-containing material comprises a transition metal. In such embodiments, the precursor suitably comprises a transition metal. In other words, and in some embodiments, M is a transition metal. Suitable transition metals include Sc, Y, Lu, Ti, Zr, Hf, V, Nb, Ta, Cr, Mo, W, Mn, Re, Fe, Ru, Os, Co, Rh, Ir, Ni, Pd, Pt, Cu, Ag, Au, Zn, Cd, and Hg.

In some embodiments, the metal-containing material comprises a lanthanide. In such embodiments, the precursor suitably comprises a lanthanide. In other words, and in some embodiments, M is a lanthanide. Suitable lanthanides include La, Ce, Pr, Nd, Pm, Sm, Eu, Gd, Tb, Dy, Ho, Er, Tm, Yb, and Lu.

In some embodiments, the metal-containing material comprises a post transition metal. In such embodiments, the precursor suitably comprises a post transition metal. In other words, and in some embodiments, M is a post transition metal. Suitable post transition metals include Ga, In, Sn, TI, Pb, and Bi.

In some embodiments, metal precursor may be pulsed more than one time, for example two, three or four times, before a halogen reactant is pulsed to the reaction chamber. Similarly, there may be more than one pulse, such as two, three or four pulses, of a halogen reactant before metal precursor is pulsed (i.e., provided) to the reaction chamber.

In some embodiments, at least one of the metal precursor pulse and the halogen reactant pulse is followed by a purge. Thus, in some embodiments, the metal precursor pulse is followed by a purge; or the halogen reactant pulse is followed by a purge; or both the metal precursor pulse and the halogen reactant pulse are followed by a purge.

Exemplary gaps include recesses, contact holes, vias, trenches, and the like. In some embodiments, the gap has a depth of at least 5 nm to at most 500 nm, or of at least 10 nm to at most 250 nm, or from at least 20 nm to at most 200 nm, or from at least 50 nm to at most 150 nm, or from at least 100 nm to at most 150 nm.

In some embodiments, the gap has a width of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap has a length of at least 10 nm to at most 10 000 nm, or of at least 20 nm to at most 5 000 nm, or from at least 40 nm to at most 2 500 nm, or from at least 80 nm to at most 1000 nm, or from at least 100 nm to at most 500 nm, or from at least 150 nm to at most 400 nm, or from at least 200 nm to at most 300 nm.

In some embodiments, the gap comprises a distal end and a sidewall that both comprise a dielectric material. In some embodiments, the gap has a surface that entirely consists of, or substantially consists of, a dielectric material. In some embodiments, the gap, including its distal end and its sidewall, is lined with a dielectric material, e.g. with a dielectric liner having a thickness of at least 1 nm to at most 50 nm, or of at least 1 nm to at most 5 nm, or of at least 5 nm to at most 20 nm, or of at least 20 nm to at most 50 nm. Exemplary dielectric materials include silicon-containing materials such as silicon oxide, silicon nitride, carbide, silicon oxynitride, silicon oxycarbide, and silicon oxynitride. Other suitable dielectric materials can comprise metal oxides such as aluminum oxide, hafnium oxide, or zirconium oxide.

In some embodiments, the gap comprises a distal end and a sidewall that both comprise a semiconducting material. In some embodiments, the gap has a surface that entirely consists of, or substantially consists of, a semiconducting material.

In some embodiments, the gap comprises a distal end and a sidewall that both comprise at least one of a metal and a semiconducting material. In some embodiments, the gap has a surface that entirely consists of, or substantially consists of, at least one of a metal and a semiconducting material.

In some embodiments, the gap comprises a distal end and a sidewall that both comprise at least one of a metallic material and a semiconducting material. In some embodiments, the gap has a surface that entirely consists of, or substantially consists of, at least one of a metallic material and a semiconducting material.

Suitable semiconducting materials include elemental semiconductors such as silicon, germanium, and alloys thereof. Suitable semiconducting materials further include compound semiconductors such as tin oxide, indium oxide, copper oxide, and alloys thereof. Suitable metallic materials include on or more metals and alloys thereof. Suitable metals include transition metals, refractory metals, and post transition metals. Exemplary metals include Mo, W, Ru, Cu, Co, and Al.

In some embodiments, the gap comprises a distal end and a sidewall that both comprise a metal. In some embodiments, the gap has a surface that entirely consists of, or substantially consists of, a metal. In some embodiments, the gap, including its distal end and its sidewall, is lined with a metal, e.g. with a metal liner that has a thickness of at least 1 nm to at most 50 nm, or of at least 1 nm to at most 5 nm, or of at least 5 nm to at most 20 nm, or of at least 20 nm to at most 50 nm.

In some embodiments, the distal end of the gap comprises a metal and the sidewall of the gap comprises a dielectric. In some embodiments, the distal end of the gap comprises a dielectric and the sidewall of the gap comprises a metal.

In some embodiments, a method as described herein is a thermal deposition process. In other words, and in some embodiments, a method as described herein can comprise a thermal reaction between a metal precursor a halogen reactant. It shall be understood that a thermal process refers to a process in which the activation energy for thermal reactions in that process is substantially provided by thermal energy. Thus, there is no need for an additional energy source such as a plasma or energetic radiation such as ultraviolet radiation for causing the reaction to proceed.

The precursor comprises a metal and an aromatic ligand. In some embodiments, the aromatic ligand is a substituted or unsubstituted benzene ring.

In some embodiments, the ligand is an alkylbenzene. Thus, in some embodiments, the precursor comprises a ligand that in turn comprises an alkyl-substituted benzene ring. Examples of such precursors include precursors comprising a metal center and one or more methylbenzene ligands, ethylbenzene ligands, or propylbenzene ligands. An exemplary precursor of this kind is bis(ethylbenzene)molybdenum. Precursors comprising an alkyl-substituted benzene ring such as bis(ethylbenzene)molybdenum can be advantageously used together with a haloalkane reactant such as 1,2-diiodoethane, for filling a gap. Thus, in some embodiments, the precursor comprises bis(ethylbenzene) molybdenum, and the halogen reactant comprises 1,2-diiodoethane.

In some embodiments, the aromatic ligand comprised in the precursor has a general structure according to formula 1:

(1)

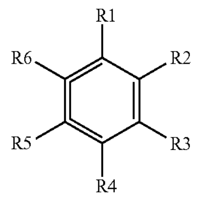

It shall be understood that each of R1 to R6 can be independently selected from H and a C1 to a C6 hydrocarbyl, such as an aliphatic hydrocarbyl, such as a linear or cyclic alkyl, such as a C1 to C6 linear alkyl.

In some embodiments, R1 is a C1 to C6 alkyl such as $CH_3$, and R2 to R6 are H. In some embodiments, R1 and R3 are an identical C1 to C6 alkyl such as $CH_3$, and R2, R4, R5, and R6 are H. In some embodiments, R1 and R4 are an identical C1 to C6 alkyl such as $CH_3$, and R2, R3, R5, and R6 are H. In some embodiments, R1 is $CH_2CH_3$, and R2 to R6 are H.

In some embodiments, the metal is molybdenum.

In some embodiments, the precursor comprises Bis(ethylbenzene)molybdenum.

In some embodiments, the precursor can comprise more than one metal. Thus, in some embodiments, the precursor comprises two or more metals.

Without the invention being limited to any particular theory or mode to operation, it is believed that, in some embodiments, a halogen reactant can preferentially catalyze metal growth at the distal end of a gap compared to a proximal surface of a substrate comprising that gap and sidewall of the gap.

The halogen reactant can, for example, comprise a bond selected from a X—X bond, a H—X bond, a C—X bond, a P—X bond, a N—X bond, and a S—X bond; wherein X is a halogen.

In some embodiments, the halogen reactant comprises at least one of an elemental halogen and a hydrogen halide. Suitable elemental halogens include $F_2$, $Cl_2$, $Br_2$, and $I_2$. Suitable hydrogen halides include HF, HCl, HBr, and HI.

In some embodiments, the halogen reactant comprises a halogenated hydrocarbon comprising two or more halogen atoms. In some embodiments, least two halogen atoms of the halogen reactant are attached to different carbon atoms. In some embodiments, the halogen reactant comprises a hydrocarbon containing at least two carbon atoms attached to each other. The halogen reactant may comprise three carbon atoms. Further, the halogen reactant may comprise four, five or six carbon atoms. The halogen reactant may comprise a linear, branched, cyclical and/or aromatic carbon chain. For example, the halogen reactant may comprise an alkyl halide.

In some embodiments, the halogen reactant comprises two or more halogen atoms, and at least two halogen atoms are attached to different carbon atoms. The halogen atoms may be the same halogen, for example bromine, iodine, fluorine or chlorine. Alternatively, the halogens may be different halogens, such as iodine and bromine, bromine and chlorine, chlorine and iodine. The halogen reactant may comprise two halogen atoms attached to different carbon atoms. The halogen reactant may comprise three halogen atoms, each attached to a different carbon atom. The halogen reactant may comprise four halogen atoms, each attached to a different carbon atom. Alternatively, in embodiments where the halogen reactant comprises three, four or more halogen atoms, some carbon atoms may be attached to two or three halogen atoms. In some embodiments, the two halogen atoms in the halogen reactant are attached to adjacent carbon atoms of a carbon, hydrogen, and halogen-containing compound. Thus, the halogen reactant may comprise two adjacent carbon atoms, each having at least one halogen substituent. In some embodiments, each of the adjacent carbon atoms has only one halogen substituent. Alternatively, one or both of the carbon atoms are attached to a halogen, may have two halogen atoms attached to it. Embodiments may be envisaged in which one or both of the carbon atoms being attached to a halogen, have three halogen atoms attached to it. The location of said two carbon atoms in a carbon chain may vary. In some embodiments, they are at the end of a carbon chain, but in some embodiments they are located away from the end of a carbon chain. As is evident to those skilled in the art, the position of a given carbon atom in a carbon chain limits the number of potential substituents available.

For example, in embodiments, where the halogen reactant comprises two carbon atoms, at least one halogen atom is attached to each carbon. If a two-carbon reactant comprises two halogen atoms, then each of them is attached to a different carbon atom. In embodiments where the halogen reactant comprises two carbon atoms and three halogens, one of the carbon atoms is doubly substituted with a halogen. In embodiments where the halogen reactant comprises two carbon atoms and four halogens, both of the carbon atoms may be doubly substituted with a halogen. Alternatively, one carbon atom may have one halogen substituent, whereas the second may have three.

In some embodiments where the halogen reactant comprises three carbon atoms and two halogen atoms, each halogen atom is attached to a different carbon atom. Thus in some embodiments, one carbon atom does not have a halogen atom attached to it. Two halogen atoms may be attached to neighboring carbon atoms (i.e., carbon atoms adjacent to each other in a carbon chain). Alternatively, there may be one carbon atom between the halogenated carbon atoms. For example, halogen reactant may comprise, consist essentially of, or consist of 1,2-dihalopropane or 1,3-dihalopropane, such as 1,2-dichloropropane, 1,3-dichloropropane, 1,2-diiodopropane or 1,3-diiodopropane, 1,2-difluoropropane or 1,3-difluoropropane.

In embodiments where the halogen reactant comprises three carbon atoms and three halogen atoms, each carbon atom may have a halogen atom attached to it. Alternatively, any one of the three carbon atoms may have two halogen atoms attached to it, and one carbon atom—either at the end of the carbon chain or in the middle of it—may be without a halogen. The doubly substituted carbon atom may be at the end of the carbon chain or in the middle of it. As a further alternative, in some embodiments, a three-carbon halogen reactant may contain four halogen atoms. In such embodiments, each carbon may have a halogen atom attached to it, and one carbon—either at the end of the carbon chain or in the middle of it—may have an additional halogen atom attached to it. As a still further alternative, two of the carbons may have two halogen atoms attached to it, whereas one carbon atom—either at the end of the carbon chain or in the middle of it—may be without a halogen. In some embodiments, the halogen reactant comprises 1,2-dihaloalkane or 1,2-dihaloalkene or 1,2-dihaloalkyne or 1,2-dihaloarene, where the halogens are attached to adjacent carbon atoms.

In embodiments in which the halogen reactant comprises four carbon, there may be two, three, four, five or six halogen substituents attached to the carbons. For example, the halogen reactant may have a formula $CH_3$—CXH—$CH_2$—$CXH_2$, $CH_3$—$CH_2$—CXH—$CXH_2$, $CH_3$—CXH—CXH—$CH_3$ or $H_2CX$—$CH_2$—$CH_2$—$CXH_2$. In embodiments where the four-carbon halogen comprises three carbons, the halogen reactant may have a formula such as $H_2CX$—CXH—$CH_2$—$CXH_2$, H2CX—CXH—CXH—$CH_3$, $HCX_2$—CXH—$CH_2$—$CH_3$, $HCX_2$—$CH_2$—CXH—$CH_3$ or $HCX_2$—$CH_2$—$CH_2$—$CXH_2$ or $CH_3$—CXH—$CX_2$—$CH_3$. In the formulas, X represents a halogen such as F, Cl, Br, or I. Examples of such reactants are 1,2-dihalobutane, 1,3-dihalobutane and 1,4-dihalobutane.

A cyclic or an aromatic halogen reactant may be used on some embodiments. In some embodiments, the halogen reactant comprises a cyclic or an aromatic compound. A halogen reactant may comprise a di-halogenated benzene ring. The benzene ring may comprise two or more halogens. The benzene ring may contain additional substituents, such as one or more alkyl groups. A halogen reactant may comprise, consist essentially of, or consist of a di-halogenated benzene, such as 1,2-dibromobenzene, 1,2-diiodobenzene or 1,2-dichloroobenzene. The di-halogenated benzene, may also be a 1,3-dihalogenated or a 1,4-dihalogenated benzene. Further, a tri-halogenated benzene, such as 1,2,3- or 1,2,4-halogenated benzene is possible. An aromatic halogen reactant may comprise four, five or six halogens. Cyclical halogen reactants may comprise a halogenated cyclopentane or a halogenated cyclohexane, for example. A cyclical halogen reactant may comprise two or more halogens. For example, a halogenated cyclohexane may contain up to twelve halogens, which may be the same or different. The halogens may be situated in cis- or trans-configuration. The halogens in a halogenated cyclohexane may be located in carbon positions 1 and 2, 1 and 3, 1 and 4, or 1,2,3 or 1,2,4. Examples of cyclic reactants are 1,2-diiodocyclohexane, 1,3-diiodocyclohexane, 1,4-diiodocyclohexane, 1,2-di bromocyclohexa ne, 1,3-di bromocyclohexa ne, 1,4-dibromocyclohexane, 1,2-difluorocyclohexane, 1,3-difluorocyclohexane, and 1,4-difluorocyclohexane.

In some embodiments, the halogen reactant has a general formula $X_aR_bC—CX_aR'_b$, wherein X is halogen, R and R' are independently H or an alkyl group, a and b are independently 1 or 2, so that for each carbon atom a+b=3. In some embodiments, X is iodine. In some embodiments, X is bromine. In some embodiments, X is chlorine. In some embodiments, a is 1 for both carbon atoms. In some embodiments a is 1 for one carbon atom, and 2 for the other carbon atom. In some embodiments, R and R' are both H.

In some embodiments, the halogen reactant comprises an alkyl halide. Suitable alkyl halides can have a chemical formula of $C_nH_{2n=2-m}X_m$, wherein n and m are integers from 1 to 4, and X is a halogen such as F, Cl, Br, and I. An exemplary alkyl halide is 1,2-diiodoethane.

In some embodiments, the halogen reactant comprises 2 or more halogen atoms attached to a carbon backbone.

In some embodiments, the halogen reactant has a general formula $X_aR_bC—(CX_cR"_d)_n—CX_aR'_b$. It shall be understood that X is a halogen, R, R' and R" are independently H or an alkyl group. Also, a and b are independently 1 or 2, so that for each carbon atom a+b=3. Also, n is 0, 1, 2, 3, 4 or 5. Also, c and d are independently 0, 1 or 2, so that for each carbon atom c+d=2.

In some embodiments, the halogen reactant has a general formula $X_aR_bC—CX_aR'_b$, wherein X is a halogen, R and R' are independently H or an alkyl group, and a and b are independently 1 or 2, so that for each carbon atom a+b=3.

In some embodiments, the halogen reactant comprises an alkyl iodide.

In some embodiments, the halogen reactant comprises 1,2-diiodoethane.

In some embodiments, the halogen reactant comprises a bond selected from a X—X bond, a H—X bond, a C—X bond, a P—X bond, a N—X bond, and a S—X bond. It shall be understood that X is a halogen.

In some embodiments, the halogen reactant comprises a 1,2-dihaloalkane or 1,2-dihaloalkene or 1,2-dihaloalkyne or a 1,2-dihaloarene.

In some embodiments, the deposition cycle further comprises a nitrogen reactant pulse. The nitrogen reactant pulse comprises exposing the substrate to a nitrogen reactant.

In some embodiments, the nitrogen reactant comprises $NH_3$. Other suitable nitrogen reactants include $N_2H_2$, $N_2$, and gas mixtures comprising N2 and H2.

The nitrogen reactant pulse can be executed, for example, after the precursor pulse, after the halogen reactant pulse, or after a purge step following the precursor pulse or the halogen reactant pulse.

In some embodiments, a deposition cycle comprises sequentially executing a plurality of subsequent precursor pulses and nitrogen reactant pulses before or after executing a halogen reactant pulse. Thus, in some embodiments, a sequence of Y deposition cycles can be represented by the following formula: ((P+N)*X+R)*Y, in which P denotes a precursor pulse, N denotes a nitrogen reactant pulse, X is an integer, R denotes a halogen reactant pulse, and Y is another integer. In some embodiments, X equals Y. In some embodiments, X and Y are different. Thus, a deposition cycle can comprise executing X sequences comprising a precursor pulse and a nitrogen reactant pulse, followed by a halogen reactant pulse. In some embodiments, X is from at least 1 to at most 20, or at least 2 to at most 10. In some embodiments, Y is from at least 1 to at most 1000, or from at least 5 to at most 2000, or from at least 25 to at most 400, or from at least 100 to at most 200.

In some embodiments, the deposition cycle further comprises an oxygen reactant pulse. The oxygen reactant pulse comprises exposing the substrate to an oxygen reactant. It shall be understood that an oxygen reactant refers to a gaseous compound that comprises oxygen. Exemplary oxygen reactants include $O_2$, $H_2O$, $O_3$, and $H_2O_2$.

The oxygen reactant pulse can be executed, for example, after the precursor pulse, after the halogen reactant pulse, or after a purge step following the precursor pulse or the halogen reactant pulse.

In some embodiments, a deposition cycle comprises sequentially executing a plurality of subsequent precursor pulses and oxygen reactant pulses before or after executing a halogen reactant pulse. Thus, in some embodiments, a sequence of Y deposition cycles can be represented by the following formula: ((P+O)*X+R)*Y, in which P denotes a precursor pulse, 0 denotes an oxygen reactant pulse, X is an integer, R denotes a halogen reactant pulse, and Y is another integer. In some embodiments, X equals Y. In some embodiments, X and Y are different. Thus, a deposition cycle can comprise executing X sequences comprising a precursor pulse and an oxygen reactant pulse, followed by a halogen reactant pulse. In some embodiments, X is from at least 1 to at most 20, or at least 2 to at most 10. In some embodiments, Y is from at least 1 to at most 1000, or from at least 5 to at most 2000, or from at least 25 to at most 400, or from at least 100 to at most 200.

In some embodiments, the deposition cycle further comprises a carbon reactant pulse. The carbon reactant pulse comprising exposing the substrate to a carbon reactant. It shall be understood that a carbon reactant refers to a gaseous compound that comprises carbon. Exemplary carbon reactants include hydrocarbons, such as aromatic or aliphatic hydrocarbons such as alkanes and alkenes. Exemplary carbon reactants include $CH_4$. In some embodiments, the carbon reactant comprises $CO_2$.

The carbon reactant pulse can be executed, for example, after the precursor pulse, after the halogen reactant pulse, or after a purge step following the precursor pulse or the halogen reactant pulse.

In some embodiments, a deposition cycle comprises sequentially executing a plurality of subsequent precursor pulses and carbon reactant pulses before or after executing a halogen reactant pulse. Thus, in some embodiments, a sequence of Y deposition cycles can be represented by the following formula: ((P+C)*X+R)*Y, in which P denotes a precursor pulse, C denotes a carbon reactant pulse, X is an integer, R denotes a halogen reactant pulse, and Y is another integer. In some embodiments, X equals Y. In some embodiments, X and Y are different. Thus, a deposition cycle can comprise executing X sequences comprising a precursor pulse and a carbon reactant pulse, followed by a halogen reactant pulse. In some embodiments, X is from at least 1 to at most 20, or at least 2 to at most 10. In some embodiments, Y is from at least 1 to at most 1000, or from at least 5 to at most 2000, or from at least 25 to at most 400, or from at least 100 to at most 200.

In some embodiments, the metal comprised in the precursor comprises molybdenum. Thus, gaps can be filled with a molybdenum-containing material. Molybdenum comprised in a material deposited according to the current disclosure may comprise elemental molybdenum and other forms of molybdenum. For example, molybdenum deposited according to the current disclosure may have partly an oxidation state of 0, +2, +3, +4, +5 and/or +6. In some embodiments, at least 60% of molybdenum is deposited as elemental metal. In some embodiments, at least 80% or at least 90% of molybdenum is deposited as elemental metal. In some embodiments, at least 93% or 95% of molybdenum is deposited as elemental metal.

It shall be understood that the precursor comprises an aromatic ligand. For example, the precursor can comprise one or more benzene rings. In some embodiments, the precursor comprises two benzene rings. One or both benzene rings may comprise hydrocarbon substituents. In some embodiments, each benzene ring of the precursor comprises an alkyl substituent. An alkyl substituent may be a methyl group, an ethyl group, or a linear or branched alkyl group comprising three, four, five or six carbon atoms. For example, the alkyl substituent of the benzene ring may be an n-propyl group or an iso-propyl group. Further, the alkyl substituent may be an n-, iso-, tert- or sec-form of a butyl, pentyl or hexyl moiety. In some embodiments, the molybdenum precursor comprises, consist essentially of, or consist of bis(ethylbenzene)molybdenum.

In an exemplary embodiment, the precursor comprises a molybdenum-containing precursor such as bis(ethylbenzene)molybdenum, the halogen reactant comprises a halogen-containing reactant such as $CH_2I—CH_2I$, and the nitrogen reactant comprises a nitrogen and hydrogen containing compound such as $NH_3$.

In some embodiments, a molybdenum-containing material, e.g. a metallic molybdenum material, may have a resistivity of from at least 5 μΩcm to at most 300 μΩcm, or from at least 10 μΩcm to about 100 μΩcm, or from at least 20 μΩcm to at most 50 μΩcm such as 10 μΩcm, 15 μΩcm, 20 μΩcm or 30 μΩcm.

Molybdenum comprised in a material formed according to a method as described herein may be at least partly in elemental form. Thus, the oxidation state of molybdenum may be zero. A molybdenum-containing material can include additional elements, such as nitrogen, carbon and/or oxygen. Other additional or alternative elements are possible. In some embodiments, the molybdenum-containing material may comprise significant proportions of other elements than molybdenum. However, in some embodiments, a molybdenum-containing material may contain substantially only molybdenum. Thus, a molybdenum-containing material may comprise, consist essentially of, or consist of molybdenum.

In some embodiments, a molybdenum-containing material may comprise, for example, about 60 to about 99 atomic percentage (at. %) molybdenum, or about 75 to about 99 at. % molybdenum, or about 75 to about 95 at. % molybdenum, or about 80 to about 95 at. % molybdenum. A molybdenum-containing material formed by a method according to the current disclosure may comprise, for example about 80 at. %, about 83 at. %, about 85 at. %, about 87 at. %, about 90 at. %, about 95 at. %, about 97 at. % or about 99 at. % molybdenum.

The resistivity of a molybdenum-containing material may be reduced using a post-deposition anneal. Annealing may be performed directly after depositing of a molybdenum-containing material, i.e., without additional layers being deposited. Alternatively, annealing may be performed after additional layers have been deposited. A molybdenum-containing material may be capped before annealing. A capping layer may comprise, consist essentially of, or consist of silicon nitride. An annealing temperature from about 320° C. to about 470° C. could be used. For example, an annealing temperature may be 330° C., 350° C., 380° C., 400° C., 430° C. or 450° C. Annealing may be performed in a gas atmosphere comprising, consist essentially of, or consist of argon, argon-hydrogen mixture, hydrogen, nitrogen or nitrogen-hydrogen mixture. Duration of annealing may be from about 1 minute to about 60 minutes, for example 5 minutes, 20 minutes, 30 minutes or 45 minutes. An annealing may be performed at a pressure of 0.05 to 760 Torr. For example, a pressure during annealing may be about 1 Torr, about 10 Torr, about 100 Torr or about 500 Torr.

In some embodiments, a method as described herein comprises a step of exposing the substrate to a transformation treatment. In some embodiments, the transformation treatment can be carried out after the gap has been filled with the material. Alternatively, the transformation treatment can be carried out cyclically. When the transformation treatment is carried out cyclically, a transformation treatment can be carried out after partially filling the gap, whereafter a transformation treatment can be carried out, after which the gap is filled a bit more, after which another transformation treatment is carried out, etc.

Thus, and in some embodiments, a method as described herein can comprise executing one or more super cycles. A super cycle comprises executing a super cycle executing a deposition cycle; and, a step of exposing the substrate to a transformation treatment.

In other words, the transformation treatment can, in some embodiments, be carried out once after the gap has been filled, or it can be carried out multiple times, i.e. gap filling steps and transformation steps can be carried out alternatingly and cyclically in order to fill a gap with a transformed material. Thus, in some embodiments, a method as described herein comprises a plurality of super cycles. A super cycle comprises a step of at least partially filling a gap comprised in a substrate with a metal-containing material and a step of exposing the substrate to a transformation treatment. For example, a method as described herein can comprise from at least 2 to at most 5, or from at least 5 to at most 10, or from at least 10 to at most 20, or from at least 20 to at most 50, or from at least 50 to at most 100 super cycles, or from at least 100 super cycles to at most 200 super cycles, or from at least 200 super cycles to at most 500 super cycles, or from at least 500 super cycles to at most 1000 super cycles.

The total number of super cycles comprised in a method as described herein depends, inter alia, on the total amount of material that is needed to fill a particular gap. In some embodiments, the method comprises from at least 1 super cycle to at most 100 super cycles, or from at least 2 super cycles to at most 80 super cycles, or from at least 3 super cycles to at most 70 super cycles, or from at least 4 super cycles to at most 60 super cycles, or from at least 5 super cycles to at most 50 super cycles, or from at least 10 super cycles to at most 40 super cycles, or from at least 20 super cycles to at most 30 super cycles. In some embodiments, the method comprises at most 100 super cycles, or at most 90 super cycles, or at most 80 super cycles, or at most 70 super cycles, or at most 60 super cycles, or at most 50 super cycles, or at most 40 super cycles, or at most 30 super cycles, or at most 20 super cycles, or at most 10 super cycles, or at most 5 super cycles, or at most 4 super cycles, or at most 3 super cycles, or at most 2 super cycles, or a single super cycle.

Any material formed by a method as described herein can be suitably subjected to a transformation treatment. In some embodiments, a molybdenum-containing material is subjected to a transformation treatment.

A transformation treatment suitably comprises subjecting the substrate to a form of energy, e.g. at least one of heat energy, radiation, and particles. Exemplary treatments comprise exposing the substrate to UV radiation. Additionally or alternatively, a transformation treatment can comprise exposing the substrate to a direct plasma, e.g. a noble gas plasma such as an argon plasma. Additionally or alternatively, a transformation treatment can comprise exposing the substrate to one or more reactive species such as ions and/or radicals generated in a remote plasma, e.g. a remote noble gas plasma, such as a remote argon plasma. Additionally or alternatively, a transformation treatment can comprise exposing the substrate to photons, e.g. at least one of UV photons, photons in the visible spectrum, IR photons, and photons in the microwave spectrum. Additionally or alternatively, a transformation treatment can comprise heating the substrate.

In some embodiments, the transformation treatment comprises exposing the substrate to a thermal anneal. Suitable anneals are known in the Art as such, and include spike anneals, microwave anneals, rapid thermal anneals (RTA), and soak anneals. A thermal anneal can suitably be performed in a cyclical manner, e.g. after a deposition step in a super cycle. Additionally or alternatively, an anneal can be performed as a post-deposition treatment.

In some embodiments, the transformation treatment comprises exposing the substrate to a thermal anneal.

In some embodiments, the thermal anneal comprises at least one of exposing the substrate to an oxidizing agent such as $O_2$, a nitridation agent such as $NH_3$, a reducing agent such as Hz, and a noble gas such as Ar.

In some embodiments, the substrate is exposed to the transformation treatment for a duration of at least 0.1 s to at most 1000 s, or of at least 0.2 s to at most 500 s, or of at least 0.5 s to at most 200 s, or of at least 1.0 s to at most 100 s, or of at least 2 s to at most 50 s, or of at least 5 s to at most 20 s.

In some embodiments, a deposition cycle in a method as described herein is carried out at a temperature of at least 300° C. to at most 400° C., or at a temperature of at least 200° C. to at most 600° C.

In some embodiments, and during the transformation treatment, the substrate is maintained at a temperature of less than 800° C., or of at least −25° C. to at most 800° C., or of at least 0° C. to at most 700° C., or of at least 25° C. to at most 600° C., or of at least 50° C. to at most 400° C., or of at least 75° C. to at most 200° C., or of at least 100° C. to at most 150° C., or of at least 150° C. to at most 300° C., or of at least 300° C. to at most 500° C., or of at least 500° C. to at most 800° C. In some embodiments, the temperature at which the substrate is maintained while the metal-containing material is formed equals the temperature at which the substrate is maintained while the metal-containing material is transformed into a transformed material.

In some embodiments, the presently described methods are carried out at a pressure of less than 760 Torr or of at least 0.2 Torr to at most 760 Torr, of at least 1 Torr to at most 100 Torr, or of at least 1 Torr to at most 10 Torr. In some embodiments, the convertible layer is deposited at a pressure of at mot 10.0 Torr, or at a pressure of at most 5.0 Torr, or at a pressure of at most 3.0 Torr, or at a pressure of at most 2.0 Torr, or at a pressure of at most 1.0 Torr, or at a pressure of at most 0.1 Torr, or at a pressure of at most $10^{-2}$ Torr, or at a pressure of at most $10^{-3}$ Torr, or at a pressure of at most $10^{-4}$ Torr, or at a pressure of at most $10^{-5}$ Torr, or at a pressure of at least 0.1 Torr to at most 10 Torr, or at a pressure of at least 0.2 Torr to at most 5 Torr, or at a pressure of at least 0.5 Torr to at most 2.0 Torr.

Further described herein is an integrated circuit. The integrated circuit comprises a gap. The gap is filled by means of a method as described herein. The filled gap can, for example, serve as a via, a contact, an interconnect, or a part thereof.

Further described herein is a system. The system comprises a reaction chamber. The system further comprises a precursor gas source. The precursor gas source comprises a metal precursor. The system further comprises a halogen reactant gas source comprising a halogen reactant. The system further comprises a controller. The controller is configured to control gas flow into the reaction chamber to fill a gap comprised in a substrate by means of a method as described herein.

Optionally, the system further comprises a transformation reactant source. The transformation reactant source can, if present, be arranged for providing a conversion reactant to the reaction chamber.

In some embodiments, the system comprises two distinct, i.e. separate, reaction chambers: a first reaction chamber and a second reaction chamber. The first reaction chamber is configured for forming a material in a gap comprised in a substrate. The second reaction chamber is configured for converting the material in the gap into a converted material. In some embodiments, the first reaction chamber is maintained at a first reaction chamber temperature, and the second reaction chamber is maintained at a second reaction chamber temperature. In some embodiments, the first reaction chamber temperature is lower than the second reaction chamber temperature, for example from at least 10° C. lower to at most 100° C. lower. In some embodiments, the first reaction chamber temperature is higher than the second reaction chamber temperature, for example from at least 10° C. higher to at most 100° C. higher. In some embodiments, the first reaction chamber temperature is equal to the second reaction chamber temperature, e.g. within a margin of 10° C., 20° C., 30° C., or 40° C.

In accordance with yet additional embodiments of the disclosure, a device or portion thereof can be formed using a method and/or a structure as described herein. The device can include a substrate, one or more insulating layers, one or more metallic layers, and one or more semiconducting layers. The device further comprises a gap filled using a method as disclosed herein.

Further described herein is an integrated circuit comprising a gap that has been filled using a method as described herein. In some embodiments, the integrated circuit comprises a buried power line comprising a metal formed using a method as described herein, such as a buried power line comprising molybdenum.

Further described is a field effect transistor comprising a gate contact comprising a material formed according to a method as described herein.

Further described is a metal contact comprising a material deposited by means of a method as described herein.

Further provided herein is a metal-insulator-metal (MIM) capacitor comprising an electrode comprising a material formed by means of a method as described herein.

FIG. 1 shows a schematic representation of an embodiment of a method as described herein. The method can be used, for example, in order to form an electrode in a semiconductor device. However, unless otherwise noted, the presently described methods are not limited to such applications. The method comprises a step (111) of positioning a substrate on a substrate support. The substrate support is positioned in a reaction chamber. Suitable substrate supports include pedestals, susceptors, and the like. The method further comprises filling a gap comprised in the substrate (112) with a metal-containing material. Suitable metal-containing materials and methods of forming them are described elsewhere herein. Optionally, the reaction chamber is then purged. When a sufficient amount of metal-containing material has been formed in the gap, the method ends (113).

Purging can be done by exposing the substrate to a purge gas which, in turn, can be done, for example, by providing a purge gas to the reaction chamber. Exemplary purge gasses include noble gasses. Exemplary noble gasses include He, Ne, Ar, Xe, and Kr. Alternatively, purging can comprise transporting the substrate through a purge gas curtain. During a purge, surplus chemicals and reaction byproducts, if any, can be removed from the substrate surface or reaction chamber, such as by purging the reaction space or by moving the substrate, before the substrate is subjected to a next step.

Figure 2:
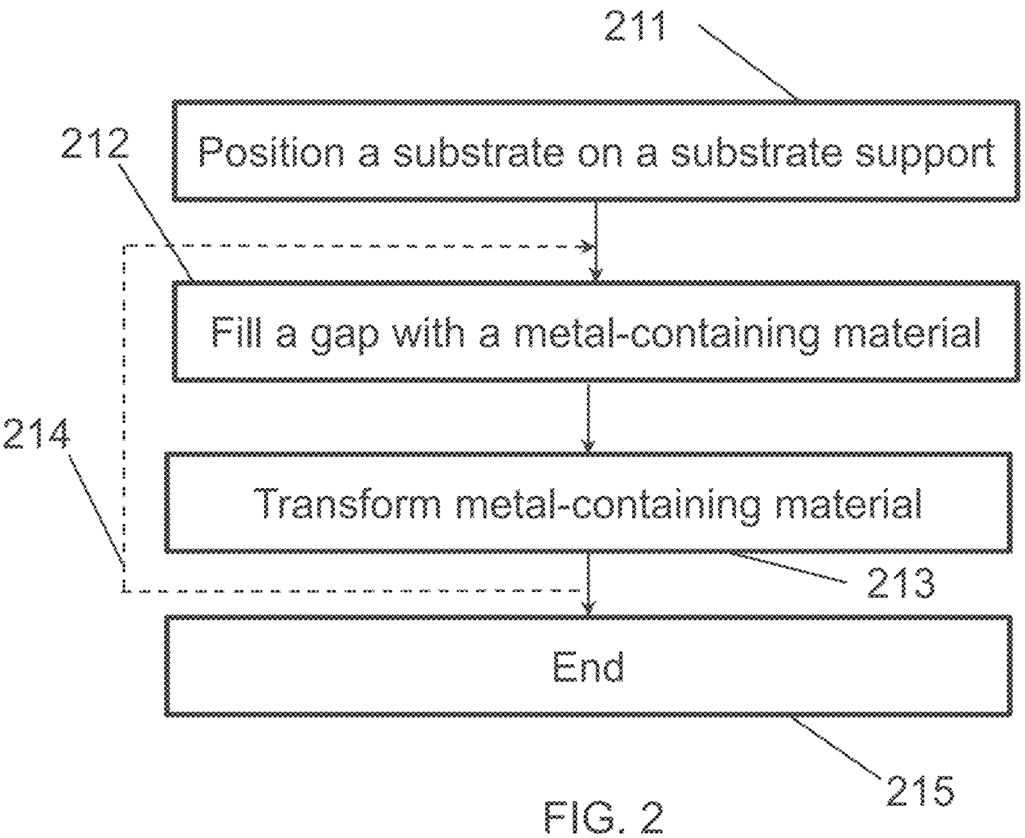
FIG. 2 illustrates an embodiment of a method as disclosed herein.

FIG. 2 schematically shows another embodiment of a method as described herein. The method of FIG. 2 is similar to that of FIG. 1 in the sense that it also comprises positioning a substrate on a substrate support (211) and filling a gap with a metal-containing material (212). The method of FIG. 2 differs from the method of FIG. 1 in that it further comprises a step of transforming the metal-containing material (213) to form a transformed material. Optionally, a purge is carried out after the step of transforming the metal-containing material (213). The step of transforming the metal-containing material (213) can comprise, for example, exposing the substrate to a direct plasma such as a direct oxygen plasma, a direct nitrogen plasma, a direct carbon plasma, or a direct noble gas plasma. Optionally, the method of FIG. 2 comprises a plurality of super cycles (214) in which the steps filling the gap with the metal-containing material (212) and transforming the metal-containing material (213) are repeated one or more times. After a predetermined amount of converted material has been formed on the substrate, the method of FIG. 2 ends (215).

Figure 3:
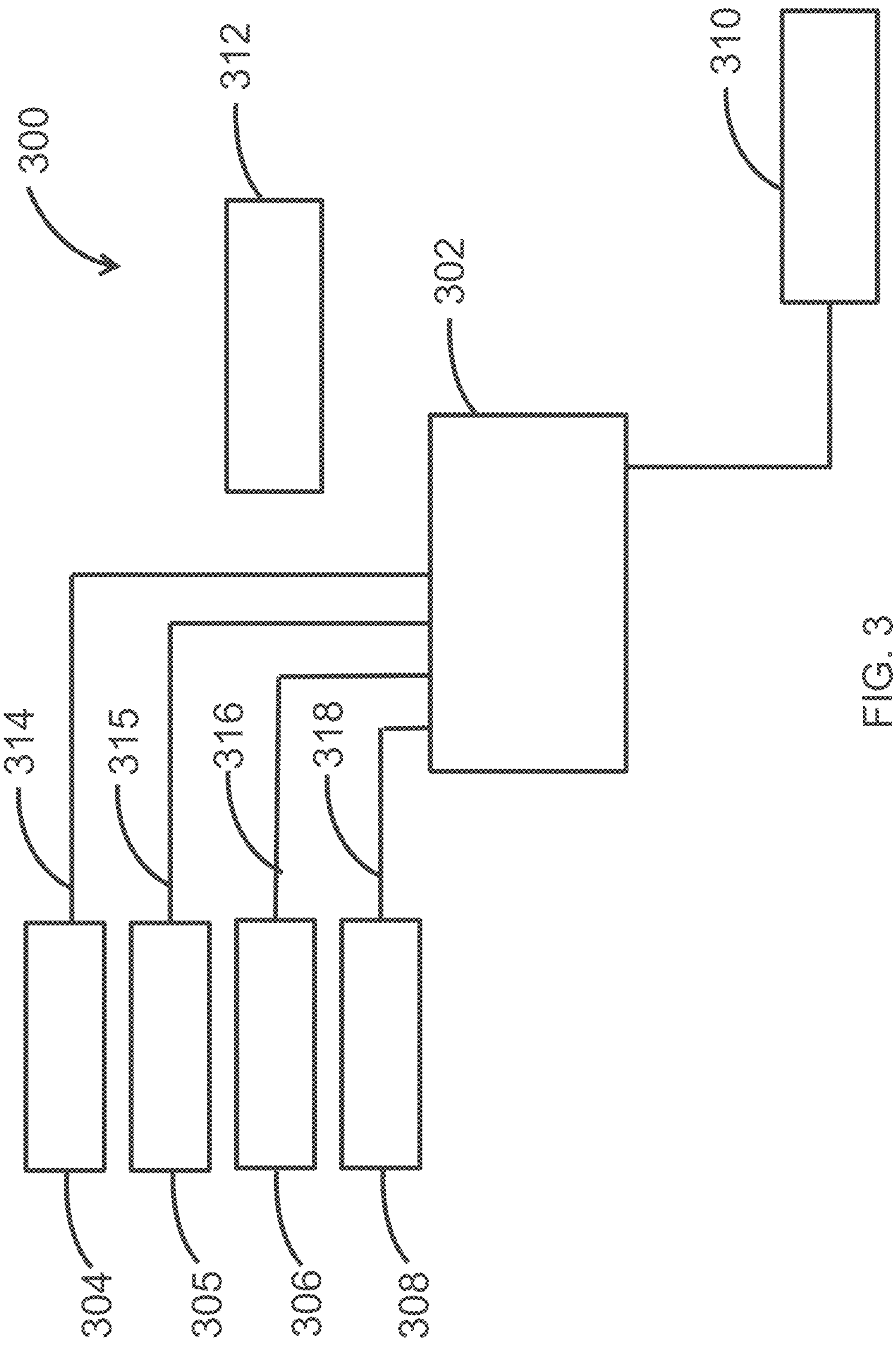
FIG. 3 illustrates an embodiment of a system (300) in accordance with yet additional exemplary embodiments of the disclosure.

FIG. 3 illustrates a system (300) in accordance with yet additional exemplary embodiments of the disclosure. The system (300) can be used to perform a method as described herein and/or form a structure or device portion, e.g. in an integrated circuit, as described herein.

In the illustrated example, the system (300) includes one or more reaction chambers (302), a metal precursor gas source (304), a halogen reactant gas source (306), a purge gas source (308), an exhaust (310), and a controller (312).

The reaction chamber (302) can include any suitable reaction chamber, such as an ALD or CVD reaction chamber. In some embodiments, the reaction chamber comprises a showerhead injector and a substrate support (not shown).

The metal precursor gas source (304) can include a vessel and one or more metal precursors as described herein. Metal precursor can be provided to the reaction chamber (302) alone or mixed with one or more carrier (e.g., noble) gases. The halogen reactant gas source (306) can comprise a vessel and one or more reactants as described herein. The halogen reactant can be provided to the reaction chamber alone or mixed with one or more carrier gases. The purge gas source (308) can include one or more purge gases, e.g. noble gases, dinitrogen, or mixtures thereof, as described herein. Although illustrated with four gas sources (304-308), the system (300) can include any suitable number of gas sources, and can include additional oxygen reactant sources, nitrogen reactant sources, carbon reactant sources, and noble gas sources, for example. The gas sources (304-308) can be coupled to reaction chamber (302) via lines (314-318), which can each include flow controllers, valves, heaters, and the like. The exhaust (310) can include one or more vacuum pumps.

The controller (312) includes electronic circuitry and software to selectively operate valves, manifolds, heaters, pumps and other components included in the system (300). Such circuitry and components operate to introduce metal precursors, one or more reactants, and purge gases from the respective sources (304-308). The controller (312) can control timing of gas pulse sequences, temperature of the substrate and/or reaction chamber, pressure within the reaction chamber, and various other operations to provide proper operation of the system (300). The controller (312) can include control software to electrically or pneumatically control valves to control flow of metal precursors, one or more reactants and purge gases into and out of the reaction chamber (302). The controller (312) can include modules such as a software or hardware component, e.g., a FPGA or ASIC, which performs certain tasks. A module can advantageously be configured to reside on the addressable storage medium of the control system and be configured to execute one or more processes.

Other configurations of the system (300) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (402). Further, as a schematic representation of a system, many components have been omitted for simplicity of illustration, and such components may include, for example, various valves, manifolds, purifiers, heaters, containers, vents, and/or bypasses.

During operation of the system (300), substrates, such as semiconductor wafers (not illustrated), are transferred from, e.g., a substrate handling system to a reaction chamber (302). Once such substrate(s) are transferred to reaction chamber (302), one or more gases from the gas sources (304-308), such as precursors, reactants, carrier gases, and/or purge gases, are introduced into the reaction chamber (302).

Figure 4:
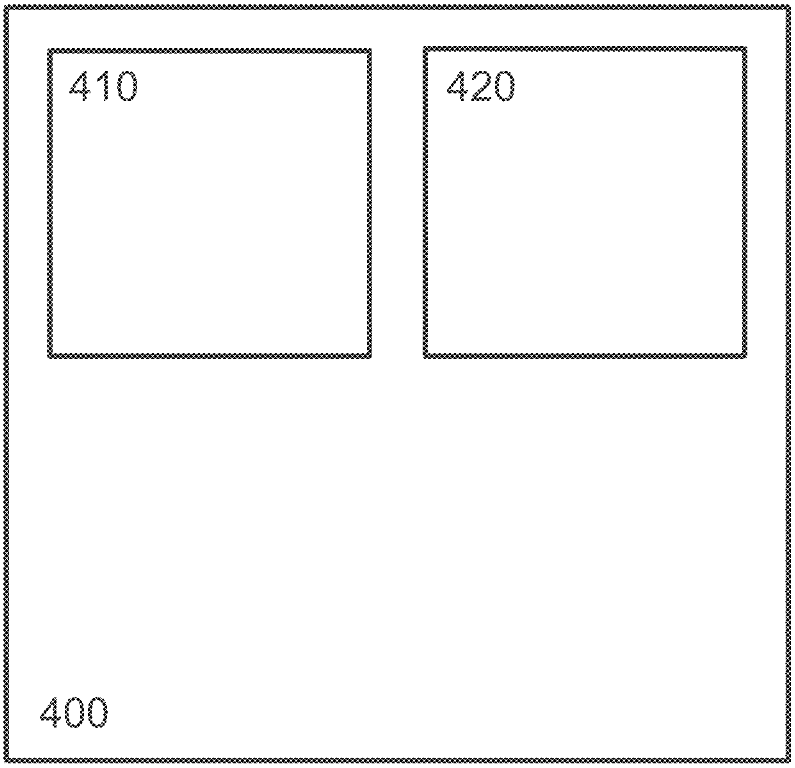
FIG. 4 shows another embodiment of a system (400) as described herein in a stylized way.

FIG. 4 shows another embodiment of a system (400) as described herein in a stylized way. The system (400) of FIG. 4 is similar to that of FIG. 3. It comprises two distinct reaction chambers: a first reaction chamber (410) and a second reaction chamber (420). The first reaction chamber (410) is arranged for filling a gap with a metal-containing material. The second reaction chamber (420) is arranged for transforming a metal-containing material into a transformed material.

Figure 5:
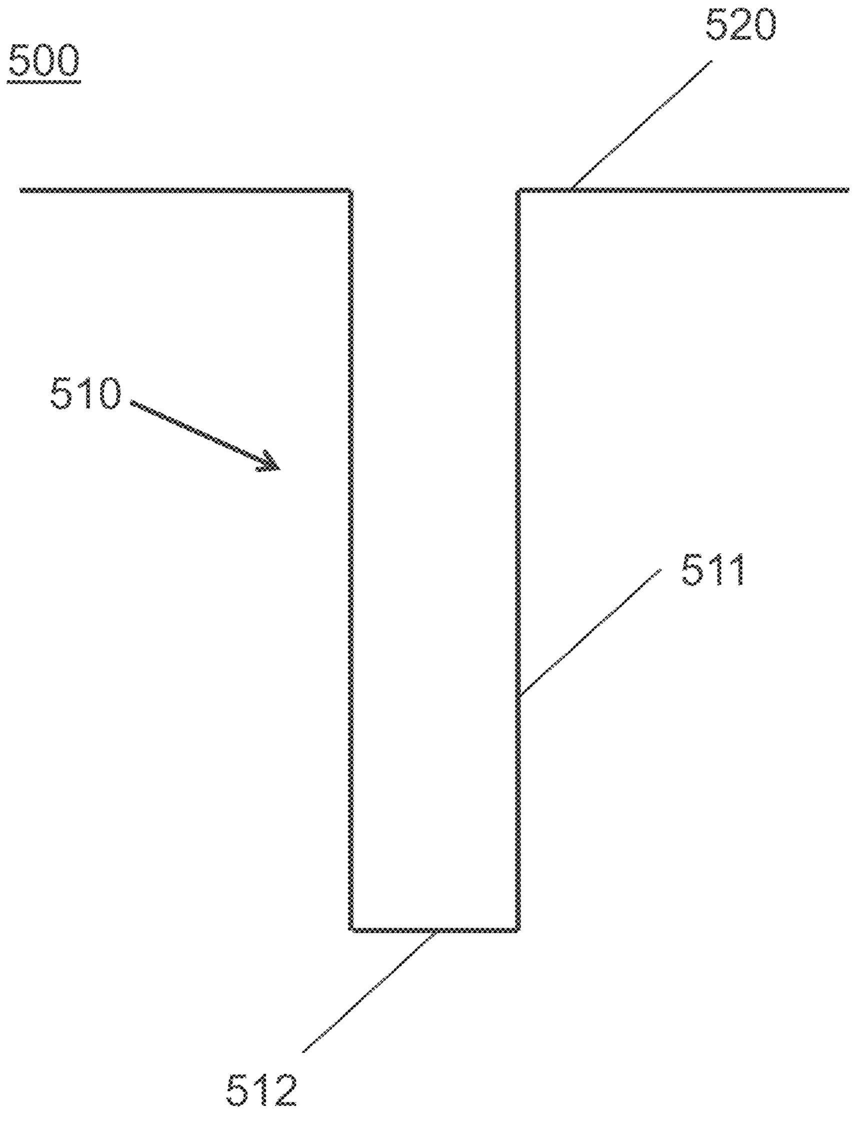
FIG. 5 shows a stylized representation of a substrate (500) comprising a gap (510).

FIG. 5 shows a schematic representation of a substrate (500) comprising a gap (510). The gap (510) comprises a sidewall (511) and a distal end (512). The substrate further comprises a proximal surface (520), which is located outside of, e.g. adjacent to, the gap. In some embodiments, the sidewall (511), the distal end (512) comprise the same material. In some embodiments, at least one of the sidewall (511) and the distal end comprise a dielectric, such as a silicon containing dielectric such as silicon oxide, silicon nitride, silicon carbide, and mixtures thereof. In some embodiments, the dielectric comprises hydrogen. In some embodiments, at least one of the sidewall (511) and the distal end (512) comprise a metal such as a transition metal, a post transition metal, and a rare earth metal. In some embodiments, the metal comprises Cu, Co, W, Ru, Mo, Al, or an alloy thereof.

In some embodiments, the sidewall (511) and the distal end (512) have an identical, or a substantially identical, composition. In some embodiments, the sidewall (511) and the distal end (512) have a different composition. In some embodiments, the sidewall and the distal end (512) comprise a dielectric. In some embodiments, the sidewall (511) and the distal end (512) comprise a metal. In some embodiments, the sidewall (511) comprises a metal and the distal end (512) comprises a dielectric. In some embodiments, the sidewall (511) comprises a dielectric and the distal end comprises a metal.

In some embodiments, the proximal surface (520) has the same composition as the sidewall (511). In some embodiments, the proximal surface (520) has a different composition than the sidewall (511). In some embodiments, the proximal surface (520) has a different composition than the distal end (512). In some embodiments, the proximal surface (520) has the same composition as the distal end (512).

In some embodiments, the proximal surface (520), the sidewall (511), and the distal end (512) comprise the same material. In some embodiments, the proximal surface (520), the sidewall (511), and the distal end (512) comprise a dielectric. In some embodiments, the proximal surface (520), the sidewall (511), and the distal end (512) comprise a metal. In some embodiments, the proximal surface (520), the sidewall (511), and the distal end (512) comprise a semiconductor.

Figure 6:
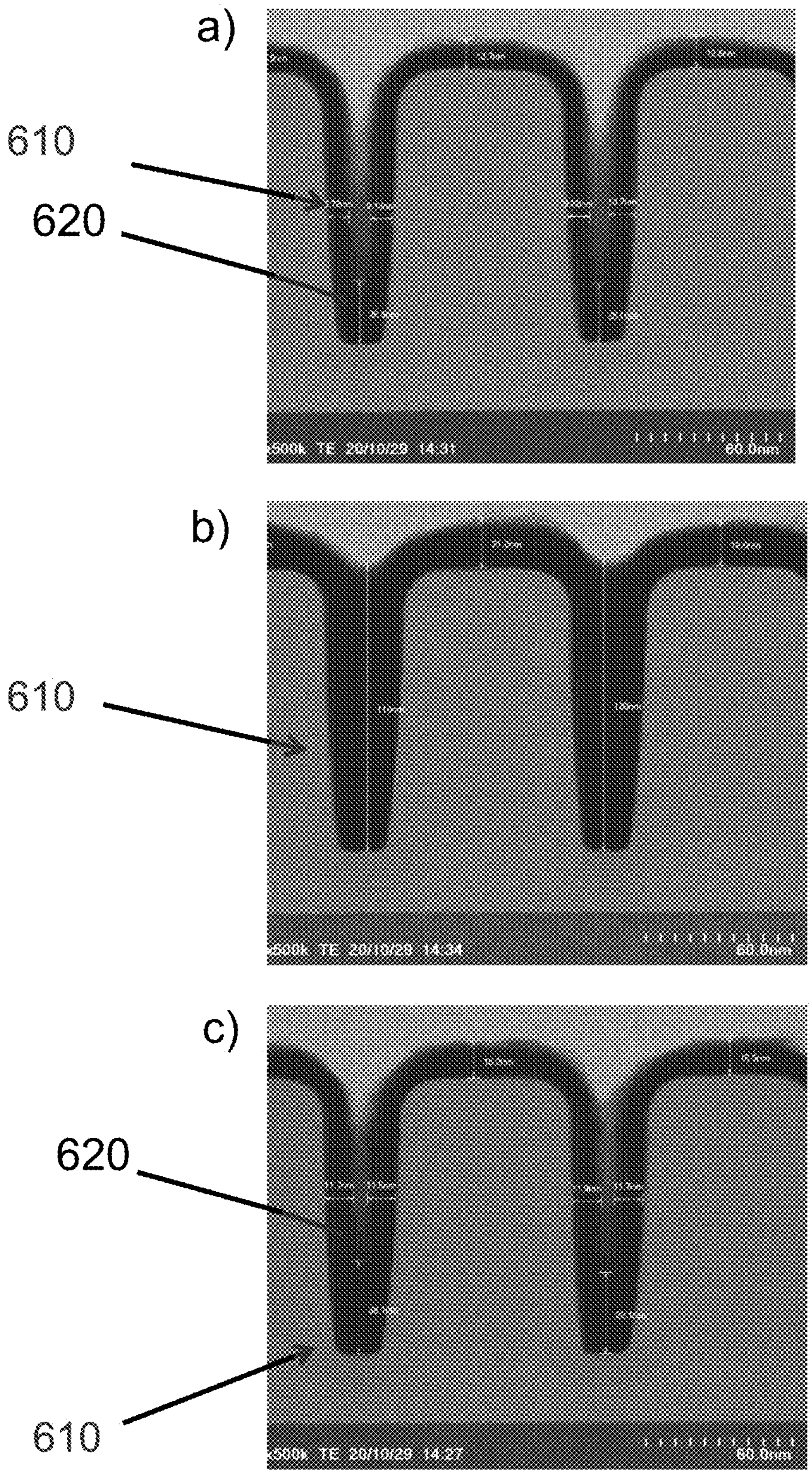
FIGS. 6 to 8 show experimental data obtained on gaps that were filled with a metal-containing material in accordance with embodiments of the present disclosure.

In a further example, reference is made to FIG. 6. FIG. 6 shows experimental data, in particular scanning transmission electron microscopy (STEM) images, obtained on structures which comprise a gap that has been at least partially filled by means of a method as described herein. In particular, bis(ethylbenzene)molybdenum, $Mo(EtBz)_2$, is used as a metal precursor, and 1,2-diiodoethane as a halogen reactant. The substrate is sequentially exposed to metal precursor in precursor pulses and to halogen reactant in halogen reactant pulses. This process results in formation of a metallic molybdenum film on planar substrates. Surprisingly, the same process results in formation of a molybdenum-containing material (620) comprising metallic molybdenum. The metallic nature of the molybdenum-containing material (620) was confirmed by means of X-ray Photoelectron Spectroscopy (XPS) measurements.

The samples shown in FIG. 6, panels a) and b) underwent a cyclical deposition process at a substrate temperature of at least 280° C. to at most 325° C., and a pressure of 2 Torr. A precursor pulse time of 12 seconds was used. After the precursor pulse, a purge time of 10 seconds was used. A halogen reactant pulse time of 10 seconds was used. After the halogen reactant pulse, a purge time of 10 seconds was used. The sample of panel a) was subjected to 75 deposition cycles, which results in molybdenum-containing material formation (620). The sample of panel b) was subjected to 110 deposition cycles. This surprisingly results in complete filling of the gap with a molybdenum-containing material, without seam formation.

The sample shown in FIG. 6, panel c) underwent a cyclical deposition process at a substrate temperature of at least 325° C. to at most 350° C. Pulse and purge times were the same as for the samples shown in FIG. 6, panels a) and b). The sample of panel c) was subjected to 55 deposition cycles, which results in molybdenum-containing material formation (620).

Figure 7:
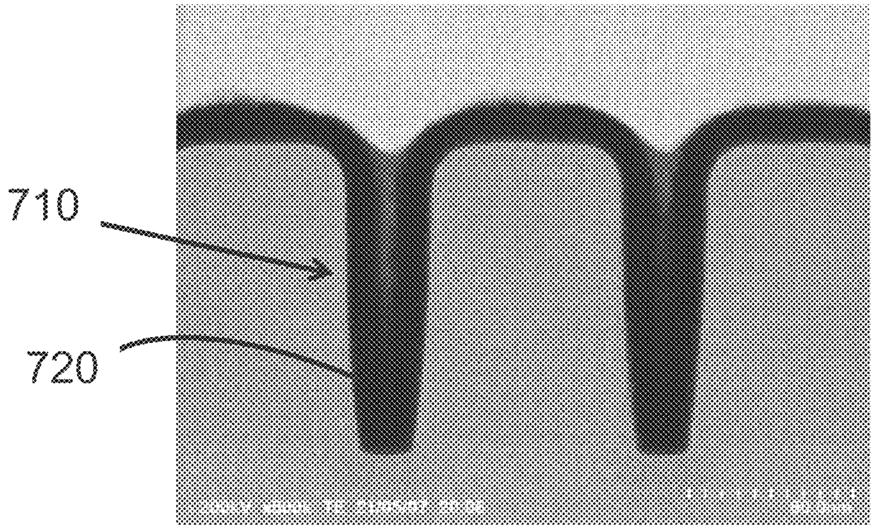
Figure 8:
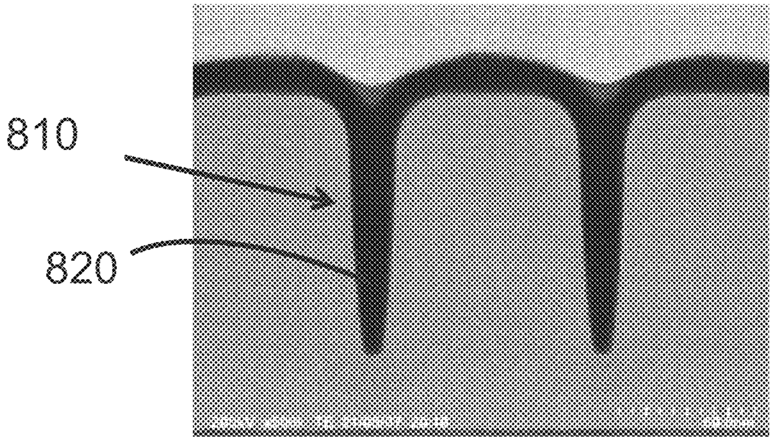

In a further exemplary embodiment, reference is made to FIGS. 7 and 8.

FIG. 7 shows gaps (710) having a critical dimension of 30 nm that have been partially filled by means of an embodiment of a method as described herein. The process the results of which are shown in FIG. 7 resulted in formation of a molybdenum-containing material (720) in the gap. In particular, FIG. 7 shows gaps that were filled using a thermal ALD process comprising 78 deposition cycles. A deposition cycle comprises, in the order given, a precursor pulse, a reactant pulse, and a nitrogen reactant pulse. The precursor used was bis(ethylbenzene)molybdenum, the halogen reactant was 1,2-diiodoethane, and the nitrogen reactant was ammonia. The precursor pulse lasted 10 seconds, and it was followed by a 5 second purge. The halogen reactant pulse lasted 0.5 seconds, and it was followed by a 5 second purge. The nitrogen reactant pulse lasted 8 seconds, and was followed by a 5 second purge. The process was carried out at a susceptor temperature of 350° C. and at a pressure of 5 Torr.

FIG. 8 shows gaps that have a critical dimension of 20 nm, and are therefore smaller than the gaps shown in FIG. 7. In particular, FIG. 8 shows gaps (810) that were filled using the same process as the process that was used to fill the gaps (710) shown in FIG. 7. Due to the smaller size of the gaps (810) of FIG. 8, these gaps (810) are completely filled with molybdenum-containing material (820). Surprisingly and advantageously, no substantial seam or void is formed.

Advantageously, some embodiments of the present methods allow filling gaps with metallic molybdenum, or with other molybdenum containing compounds, without formation of any voids or seams. The methods can be applied even for high aspect ratio gaps and/or capillary gaps having a small critical dimension, e.g. gaps having a critical dimension in the order of magnitude of 10 to 20 nm or lower.

The invention claimed is:

1. A method of filling a gap, the method comprising providing a substrate to a reaction chamber, the substrate comprising the gap, the substrate further comprising a proximal surface, the gap comprising a distal end and a sidewall;

executing a plurality of super cycles, a super cycle comprising:

a deposition cycle comprising a precursor pulse and a halogen reactant pulse; and a step of exposing the substrate to a transformation treatment;

the precursor pulse comprising exposing the substrate to a precursor, the precursor comprising a compound having the general formula $ML_n$, wherein M is a metal, wherein L is an aromatic ligand, and wherein n is an integer from at least 1 to at most 6;

the halogen reactant pulse comprising exposing the substrate to a halogen reactant, the halogen reactant comprising a halogen;

thereby at least partially filling the gap by preferentially forming a metal-containing material on the distal end compared to the proximal surface and the sidewall.

2. The method according to claim 1 wherein the distal end and the sidewall both comprise a dielectric material.

3. The method according to claim 1 wherein the distal end and the sidewall both comprise at least one of a metallic material and a semiconducting material.

4. The method according to claim 1 wherein the aromatic ligand is a substituted or unsubstituted benzene ring.

5. The method according to claim 4 wherein the ligand is an alkylbenzene.

6. The method according to claim 1 wherein the metal is molybdenum.

7. The method according to claim 6 wherein the precursor comprises bis(ethylbenzene)molybdenum.

8. The method according to claim 1 wherein the halogen reactant comprises an alkyl halide.

9. The method according to claim 8 wherein the halogen reactant comprises an alkyl iodide.

10. The method of claim 8, wherein the halogen reactant has a general formula $X_aR_bC—CX_aR'_b$, wherein X is a halogen, R and R' are independently H or an alkyl group, and a and b are independently 1 or 2, so that for each carbon atom a+b=3.

11. The method according to claim 1 wherein the halogen reactant comprises a bond selected from a X—X bond, a H—X bond, a C—X bond, a P—X bond, a N—X bond, and a S—X bond; wherein X is a halogen.

12. The method according to claim 1 wherein the deposition cycle further comprises a nitrogen reactant pulse, the nitrogen reactant pulse comprising exposing the substrate to a nitrogen reactant.

13. The method according to claim 12 wherein the nitrogen reactant comprises $NH_3$.

14. The method according to claim 1 wherein the deposition cycle further comprises an oxygen reactant pulse, the oxygen reactant pulse comprising exposing the substrate to an oxygen reactant.

15. The method according to claim 1 wherein the deposition cycle further comprises a carbon reactant pulse, the carbon reactant pulse comprising exposing the substrate to a carbon reactant.

16. An integrated circuit comprising a gap, the gap being filled by means of a method according to claim 1.

17. A system comprising:
a reaction chamber;
a metal precursor gas source comprising a metal precursor;
a halogen reactant gas source comprising a halogen reactant; and,
a controller, wherein the controller is configured to control gas flow into the reaction chamber to fill a gap comprised in a substrate by means of a method according to claim 1.

18. The method according to claim 1, wherein the transformation treatment comprises exposing the substrate to a thermal anneal.

19. The method according to claim 18 wherein the thermal anneal comprises at least one of exposing the substrate to an oxidizing agent, a nitridation agent, a reducing agent, and a noble gas.

* * * * *